(12) United States Patent
Cole et al.

(10) Patent No.: US 6,705,925 B1
(45) Date of Patent: *Mar. 16, 2004

(54) APPARATUS AND METHOD TO DICE INTEGRATED CIRCUITS FROM A WAFER USING A PRESSURIZED JET

(75) Inventors: Robert Cole, Mt. Hamilton, CA (US); David James Quirke, San Jose, CA (US); Chris P. Calkins, San Jose, CA (US)

(73) Assignee: Lightwave Microsystems, San Jose, CA (US)

( * ) Notice: Subject to any disclaimer, the term of this patent is extended or adjusted under 35 U.S.C. 154(b) by 99 days.

This patent is subject to a terminal disclaimer.

(21) Appl. No.: 09/874,950

(22) Filed: Jun. 5, 2001

Related U.S. Application Data

(63) Continuation-in-part of application No. 09/693,347, filed on Oct. 20, 2000, now abandoned.

(51) Int. Cl.⁷ .................................................. B24C 1/00
(52) U.S. Cl. .............................. 451/36; 451/38; 451/75; 451/8; 451/102; 125/13.01
(58) Field of Search ................................ 451/36, 37, 38, 451/39, 40, 5, 6, 8, 9, 10, 75, 80, 102, 89; 125/12, 13.01, 125

(56) References Cited

U.S. PATENT DOCUMENTS

| | | | |
|---|---|---|---|
| 4,301,470 A | * 11/1981 | Pagany | 348/95 |
| 4,328,553 A | * 5/1982 | Fredriksen et al. | 356/139.04 |
| 4,478,368 A | 10/1984 | Yie | |
| 4,555,872 A | 12/1985 | Yie | |
| 4,648,215 A | 3/1987 | Hashish et al. | |
| 4,705,016 A | * 11/1987 | Sekiya | 125/13.01 |
| 4,893,440 A | 1/1990 | Gallant et al. | |
| 5,160,403 A | 11/1992 | Fisher et al. | |
| 5,184,434 A | 2/1993 | Hollinger et al. | |
| 5,279,075 A | * 1/1994 | Sage et al. | 451/2 |
| 5,527,204 A | 6/1996 | Rhoades | |
| 5,567,964 A | 10/1996 | Kashirhara et al. | |
| 5,587,605 A | 12/1996 | Ramsey et al. | |
| 5,637,030 A | 6/1997 | Chopra et al. | |
| 5,679,058 A | 10/1997 | Rhoades | |
| 5,757,445 A | 5/1998 | Vu et al. | |

(List continued on next page.)

FOREIGN PATENT DOCUMENTS

EP 0180430 5/1986

*Primary Examiner*—Joseph J. Hail, III
*Assistant Examiner*—Hadi Shakeri
(74) *Attorney, Agent, or Firm*—Amin & Turocy, LLP

(57) ABSTRACT

An apparatus and method to cut irregularly shaped dice from a wafer using a fluid jet cutting system. One embodiment of the invention involves a method to cut irregularly shaped dice from a wafer, such as planar light-wave circuit device. The method includes placing a wafer on a fixture; aligning the wafer in the fixture to expose the dice to a fluid jet cutting nozzle; supplying an abrasive to the fluid jet cutting nozzle; supplying a pressurized fluid to the fluid jet cutting nozzle expelling the abrasive in combination with the fluid from the fluid jet cutting nozzle at a velocity sufficient to cut through the wafer, while the fluid jet cutting nozzle moves in relation to the wafer in the fixture; and removing the dice from the fixture after the dice have been cut from the wafer. A second embodiment of the invention is directed to an apparatus to provide a wafer die cutting system to cut a wafer. The apparatus includes a fixture to align and hold the wafer; a cutting nozzle to expel a fluid and an abrasive towards the wafer at a velocity sufficient to cut through the wafer; a fluid source to supply the fluid to the cutting nozzle; an abrasive source to supply the abrasive to the cutting nozzle; and a mechanism to move the cutting nozzle relative to the wafer in the fixture.

26 Claims, 8 Drawing Sheets

U.S. PATENT DOCUMENTS

| | | |
|---|---|---|
| 5,776,796 A | 7/1998 | Distefano et al. |
| 5,782,673 A | 7/1998 | Warehime |
| 5,840,597 A | 11/1998 | Hartauer |
| 5,908,349 A | 6/1999 | Warehime |
| 5,926,586 A | 7/1999 | Dragone et al. |
| 5,962,862 A | 10/1999 | Evers et al. |
| 6,002,163 A | 12/1999 | Wojnarowski |
| 6,014,965 A * | 1/2000 | Nishida ................. 125/12 |
| 6,077,152 A | 6/2000 | Warehime |
| 6,080,907 A | 6/2000 | Miller |
| 6,180,497 B1 | 1/2001 | Sato et al. |
| 6,191,473 B1 | 2/2001 | Distefano |
| 6,325,059 B1 * | 12/2001 | Tieber ................. 125/35 |

\* cited by examiner

US 6,705,925 B1

APPARATUS AND METHOD TO DICE INTEGRATED CIRCUITS FROM A WAFER USING A PRESSURIZED JET

RELATED APPLICATION

This Application is Continuation-In-Part of U.S. application Ser. No. 09/693,347 filed on Oct. 20, 2000, now abandoned.

FIELD OF THE INVENTION

The present invention generally relates to an apparatus and method to dice integrated circuits by high-pressure fluid jet, and more specifically to an apparatus and method to dice integrated circuits such as planar light-wave circuits from a wafer by an abrasive water jet.

DESCRIPTION OF THE PRIOR ART

Planar light-wave circuits are increasingly used in many optical and electro-optical systems (e.g., computer systems, programmable electronic systems, telecommunication switching systems, control systems, and so forth). A planar light-wave circuit (PLC) can be fabricated on a wafer by processes nearly identical to the processes used to fabricate electronic integrated circuits on a semiconductor wafer. In some cases PLCs may be fabricated on rectangular pieces of a wafer like electronic integrated circuit chips, but in many cases PLCs are preferably fabricated on irregularly shaped pieces of a wafer in order to increases the PLC yield from each wafer.

FIG. 1A illustrates part of a wafer containing an array of identical, irregularly shaped PLCs 102, 104, 106, 108, 110, 112, and 114. Each PLC contains a non-rectangular structure that does not completely fit in a rectangular sample cut from the wafer by cuts 116 and 118 (shown as dotted lines). FIG. 1B shows how conventional rectangular die cutting will result in the cutting and loss of several PLCs, where only PLC 110 is intact and PLCs 106, 108, 112, and 114 have been damaged. The PLC wafer yield and resulting fabrication cost for contains a non-rectangular structure that does not completely fit in a rectangular sample cut from the wafer by cuts 116 and 118 (shown as dotted lines). FIG. 1B shows how conventional rectangular die cutting will result in the cutting and loss of several PLCs, where only PLC 110 is intact and PLCs 106, 108, 112, and 114 have been damaged. The PLC wafer yield and resulting fabrication cost for each PLC would be greatly improved by a dicing apparatus and method for cutting a wafer into separate non-rectangular dice. FIG. IC illustrates one PLC 102, which has been precisely cut from the wafer.

However, the cutting of wafers into such irregular shapes is extremely difficult with conventional wafer dicing methods and apparatus (i.e., a rotating abrasive blade saw). Conventional wafer dicing methods and apparatus are particularly inadequate for cutting a die with non-rectangular edges. Laser cutting can be used to cut irregularly shaped dice from a wafer, but laser cutting has several disadvantages. These disadvantages include very high equipment and operational costs, and poor edge quality resulting from thermal stresses and differential absorption of laser energy by various structures and layers on the wafer. The poor edge quality of the laser die cutting can create fractures in a die that ultimately propagate towards the center of the die, and thereby create operational and reliability problems.

There is an unmet need in the art to use a low cost apparatus and method to cut irregularly shaped dice from a wafer in order to increase the yield of dice from each wafer and reduce the unit cost of fabricating the dice.

There is also an unmet need in the art to have an apparatus and method to cut a die with high quality edges that do not propagate fractures into the operational areas of the die.

SUMMARY OF THE INVENTION

The invention provides a low cost apparatus and method to cut irregularly shaped dice from a wafer in order to increase the yield of dice from each wafer and reduce the unit cost of fabricating the dice The invention also provides an apparatus and method to cut a die with high quality edges that do not propagate fractures into the operational areas of the die.

A first aspect of the invention is directed to a method to cut irregularly shaped dice from a wafer. The method includes placing the wafer on a fixture; aligning the wafer in the fixture to expose the dice to a fluid jet cutting nozzle; expelling the abrasive in combination with the fluid from the fluid jet cutting nozzle at a velocity sufficient to cut through the wafer, while the fluid jet cutting nozzle moves in relation to the wafer in the fixture; and removing the dice from the fixture after the dice have been cut from the wafer.

A second aspect of the invention is directed to an apparatus to provide a wafer die cutting system to cut a wafer. The apparatus includes a fixture to align and hold the wafer; a cutting nozzle to expel a fluid and an abrasive towards the wafer at a velocity sufficient to cut through the wafer; a fluid source to supply the fluid to the cutting nozzle; an abrasive source to supply the abrasive to the cutting nozzle; and a mechanism to move the cutting nozzle relative to the wafer.

These and other advantages of the invention will become apparent to those skilled in the art from the following detailed description of the invention and the accompanying drawings.

DETAILED DESCRIPTION OF THE INVENTION

Figure 1A:
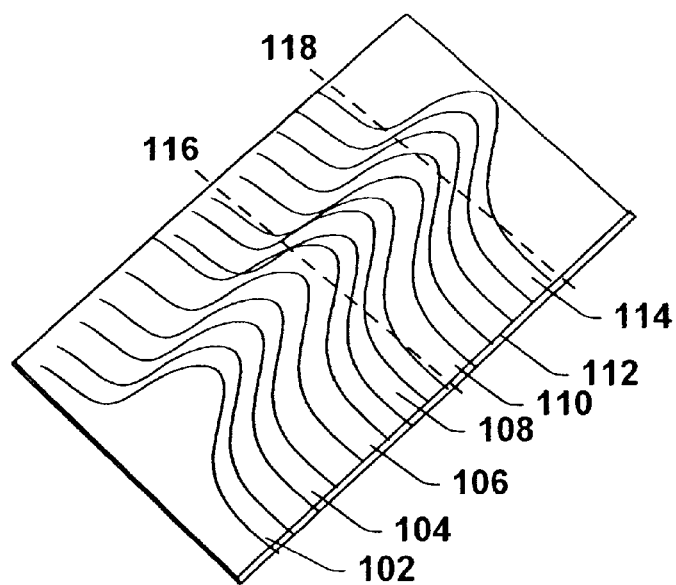
FIG. 1A illustrates part of wafer containing an array of identical, irregularly shaped planar light-wave circuits (PLCs).
Figure 1B:
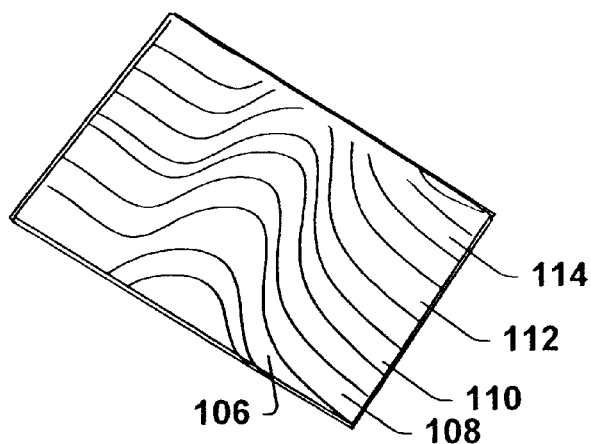
FIG. 1B shows how conventional rectangular die cutting will result in the cutting and loss of several PLCS, where only one PLC is intact and four other PLCs have been damaged.
Figure 1C:
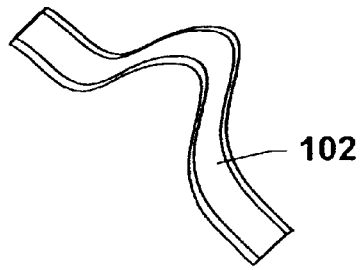
FIG. 1C illustrates one PLC, which has been precisely cut from the wafer.

This invention provides an apparatus and method to cut irregularly or regularly shaped dice from a substrate (e.g., a wafer or plate) using curvilinear cutting. In one embodiment of the invention, PLC dice with curved edges (non-straight, non-rectangular shape) are cut from a wafer. In many embodiments, the substrate is composed of a material, such as various compositions of polymers, ceramics, glass (e.g., borosilicate glass, and other low-coefficient of thermal expansion glass), pure or doped silicon, germanium, gallium arsenide, or other semiconductor compounds of III–V elements or II–VI elements.

Relatively non-compressible fluids, such as water, are preferably used in such systems, at pressures ranging from 36,000 pounds per square inch (36,000 PSI or 2400 bar) to 100,000 PSI (7000 bar). In other embodiments, water is used at pressures ranging from 40,000 PSI (2700 bar) to 60,000 PSI (4100 bar).

The energy required for cutting materials is obtained by pressurizing water or other fluids to ultra-high pressures and forming an intense cutting stream by focusing this high-speed fluid through a cutting nozzle with a very small internal diameter. A major component of a fluid jet cutting system is an intensifier pump.

To achieve these pressures, water is introduced into the unit by way of a booster pump and filter. The filter must clean the water before it reaches ultra-high pressures to protect the high-pressure parts and provide a consistent cutting stream. After being filtered the water enters high-pressure cylinder, where the water is pressurized to the desired level. The water is then channeled to an abrasive water-cutting nozzle.

In one embodiment of the invention, an abrasive unit supplies a fine mesh abrasive to the cutting stream. An abrasive unit typically includes an abrasive hopper, an abrasive feeder system, a pneumatically controlled on/off valve, and the abrasive cutting nozzle.

The abrasive is first stored in a pressurized abrasive hopper and travels to a metering assembly, which controls the amount of particles fed to the nozzle. The abrasive is then introduced into the cutting stream in a special mixing chamber within the abrasive cutting head. Abrasive cutting allows harder materials to be cut at a faster rate by accelerating the erosion process. After the cut, residual energy from the cutting stream is dissipated in a catcher tank, which stores the kerf material (i.e., the eroded substrate material) and the spent abrasive.

The reuse of the spent abrasive permits economic use of harder, but more expensive abrasives, with resulting enhancements in the efficiency of cutting and machining operations. For example, silicon carbide may be substituted in cutting operations where garnet has been used for cost containment reasons. In some embodiments, the abrasive is used at concentrations of about 5 to about 60 percent by weight.

Various abrasive powders can be used, such a olivine, garnet, corundum, aluminum oxide, diamond, silica, tungsten carbide, silicon carbide, various ceramic powders, and similarly hard powders (e.g., compounds of metal oxides). In some embodiments, the average diameters of the abrasive particles range from about 0.1 micron to 2,000 microns. In other embodiments, the average diameters range from about 0.1 micron to 200 microns.

In one embodiment, the average particle diameters do not exceed about 20 percent of the orifice diameter, and in another embodiment, the average particle diameters do not exceed about 10 percent of the orifice diameter. If the average particle diameter is larger, these is a risk that "bridging" across the orifice will occur, plugging the flow through the orifice.

The cutting nozzle diameter is generally determined by other parameters. In particular, the diameter of the cutting nozzle orifice is determined by the following parameters: First, the wider the orifice, the wider the jet stream, and the greater the kerf. The accuracy of the cut will generally vary as the inverse of the diameter of the cutting nozzle orifice. Generally, in cutting thin materials, the smaller the orifice, the better the accuracy and detail, subject to other parameters. Less cutting medium is used per unit length of cut. Second, the wider the orifice, the greater the mass flow of the jet stream, and the greater the rate of cutting. Thus, wider orifices increase the cutting rate, subject to other considerations; but more cutting medium is used in relation to the length of the cut.

Cutting nozzle diameters of about 0.1 millimeter to 1 millimeter (about 3 mils to 40 mils) can be used. The cutting nozzle orifice may be formed from hard 20 metal alloys, hard facing materials such as tungsten or silicon carbide, ceramic compounds, or crystalline materials (e.g., ruby, sapphire, diamond, and so forth). The selection of suitable material will ordinarily be determined by the hardness of the selected abrasive and the cost of the cutting nozzle material. Diamond is more durable and is preferred ad the cutting nozzle material.

The standoff distance (i.e., the distance between the cutting nozzle and the substrate surface) is also an important factor in the quality of the cutting by an abrasive water jet. Although cut quality, particularly the width and shape of the cut, will be affected significantly by standoff up to about 2.5 cm (about 1 inch), abrasive water jets can cut at standoff distances of up to about 25 cm to about 30 cm (about 10 inches to about 12 inches).

The cutting nozzle can be stationary or integrated into automated motion equipment which allows for intricate shapes and designed to be cut. Motion equipment can range from a simple cross-cutter to two-dimensional (2-D) and three-dimensional (3-D) systems or multiple axis robots. In other embodiments, computer-aided-design (CAD) or computer-aided-controllers (CNC) to translate drawings or commands into a digitally programmed path for the cutting head to follow.

One major problem is the positional drift in the photolithography fabrication of dice on a wafer. Even if the wafer is accurately positioned within the fluid jet cutting system, the dice cutting will not be accurate enough for high yield if only the perimeter of the wafer is used for alignment.

Figure 2:
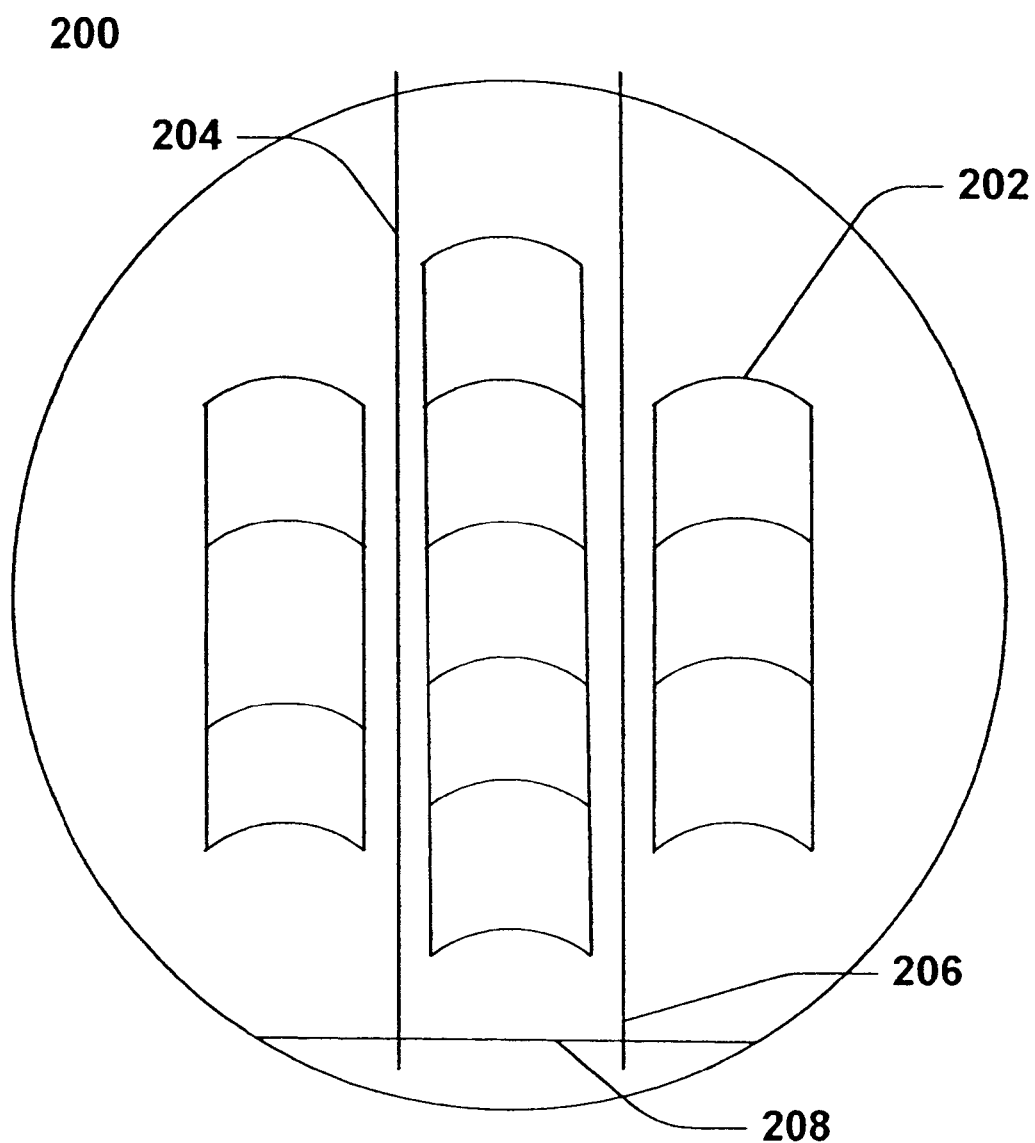
FIG. 2 illustrates one embodiment of the invention using a segmented wafer.

FIG. 2 illustrates one preferred embodiment of the invention using a segmented wafer 200. The cuts 204, 206, and 208 should be cut in alignment with the photolithography of the dice 202, so that the segmented wafer 200 is correctly positioned by position stops in a fixture for cutting on a fluid jet cutting system, in spite of positional drift in the photolithography of the dice 202 on the segmented wafer 200.

In one embodiment, these parallel cuts 204 and 206 are perpendicular to cut 208. All the cuts are made by a dicing machine having a precision alignment system, such as a visual alignment system with one or more cameras that inspect each wafer for alignment marks made by the same photolithography that fabricated the dice on the wafer. In alternative embodiments, these cuts 204, 206, and 208 are made on any cutting system that can precisely align the cuts 204, 206, and 208 in orientation to the dice 202 on each segmented wafer 200.

Figure 3:
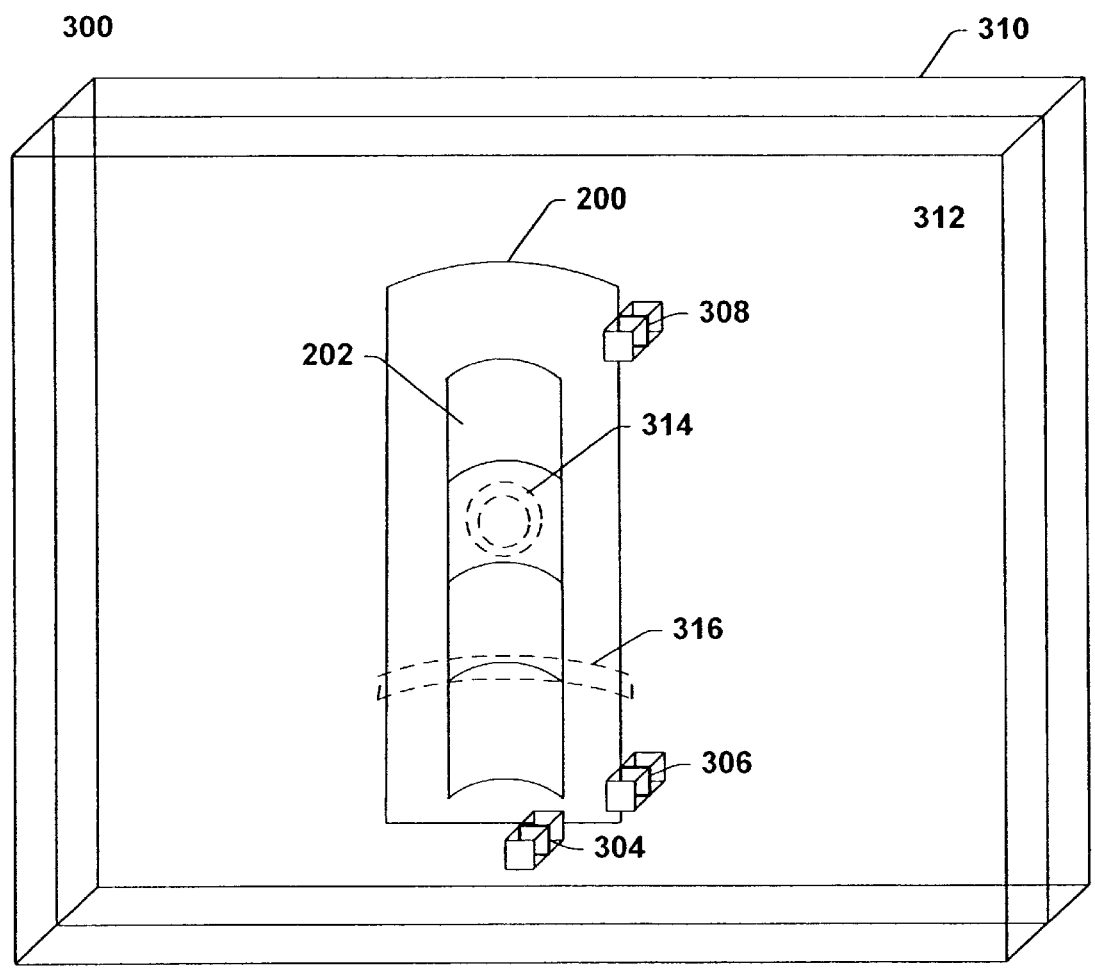
FIG. 3 illustrates one embodiment of the invention for a fixture.

FIG. 3 illustrates one embodiment of the invention for a fixture 300. The fixture, 200 has positioning stops 304, 306, and 308 (e.g., posts or pins with rectangular or other polygonal cross-sections, or fences) to align the X-axis, Y-axis, and theta (angular) orientation of the fluid jet cutting system. In another embodiment, the segmented wafer 200 has a plurality of cuts through each wafer (as shown in FIG. 2) to precisely match the positioning stops 304, 306, and 308 to the location of the dice 202.

In other embodiments, the positioning stops are pins with a diameter ranging from 60 mils (0.15 cm) to 500 mils (1.25 cm) and a height ranging from approximately 20 mils (0.05 cm) to 100 mils (0.25 cm) high. Three pins are sufficient to accurately align a wafer segment in the fixture 300, but alternative embodiments can use more than three pins, a fence (e.g., a rectangular projection) and a pin, or two fences to align a wafer segment in the fixture 300. The pins and fences are normally made from the same material as the fixture, but the pins and fences can be made from a different material.

In other embodiments, the fixture 300 has a thickness ranging from 2 inches (5.1 cm) to 10 inches (25.4 cm). The fixture 300 preferably includes surface grooves 314 under the dice to act as vacuum recesses to clamp the cut wafer dice, and trenches 316 under the dice cutting paths, partly filled with water to absorb the water jet energy and minimize the cutting of the fixture 300. In another embodiment, the vacuum recesses are 50 mils (0.125 cm) deep and 50 mils (0.125 cm) wide, and the trenches are 1.5 inches (3.75 cm) deep and 200 mils (0.50 cm) wide. The vacuum recesses are connected to a network of channels (not shown) inside the fixture, and the channels are externally connected through a valve and hose (not shown) to a vacuum pump. Alternative embodiments can use appropriate dice-specific locations and dimensions for the vacuum recesses and trenches, or selectively omit the use of vacuum recessed an trenches.

In yet another embodiment, the fixture 300 is fabricated from a stainless steel alloy (e.g., 440C hardened stainless steel or 303 stainless steel). Some embodiments use a fixture material chosen for low replacement cost (e.g., aluminum, an aluminum alloy, glass, or equivalents) or for greater resistance to fluid jet cutting (e.g., steel alloys, various stainless steels, titanium alloys, ceramic, and the like).

In another embodiment, the fixture 300 has a bolted bottom half of 310 with positioning stops 304, 306, and 308 that go through the removable top half of 312 to help enable accurate orientation of the top half of 312 fixture 300 relative to the fluid jet cutting system. In another embodiment, the fixture 300 does not have a top half or a bottom half, and the fixture 300 is always bolted or clamped in a fixed orientation to the fluid jet cutting system.

In another embodiment, the coordinates of the fluid jet cutting system are aligned to the coordinates of a wafer segment by moving the cutting nozzle to two or more locations on the wafer segment or the bolted fixture. Hardware and software in the fluid jet cutting system would note these locations and calculate the necessary adjustments for the coordinate system. A calibration or test wafer is used to verify that the fluid jet cutting system has made the correct adjustments, or can be used to make corrective coordinate adjustments.

In an alternative embodiment, a visual alignment system is used for a robot to place the fixture in the fluid jet cutting system. In yet another embodiment, the fluid jet cutting system itself has a visual alignment system (discussed below) to align the coordinates of a wafer segment to the coordinates of the fluid jet cutting system.

Figure 4:
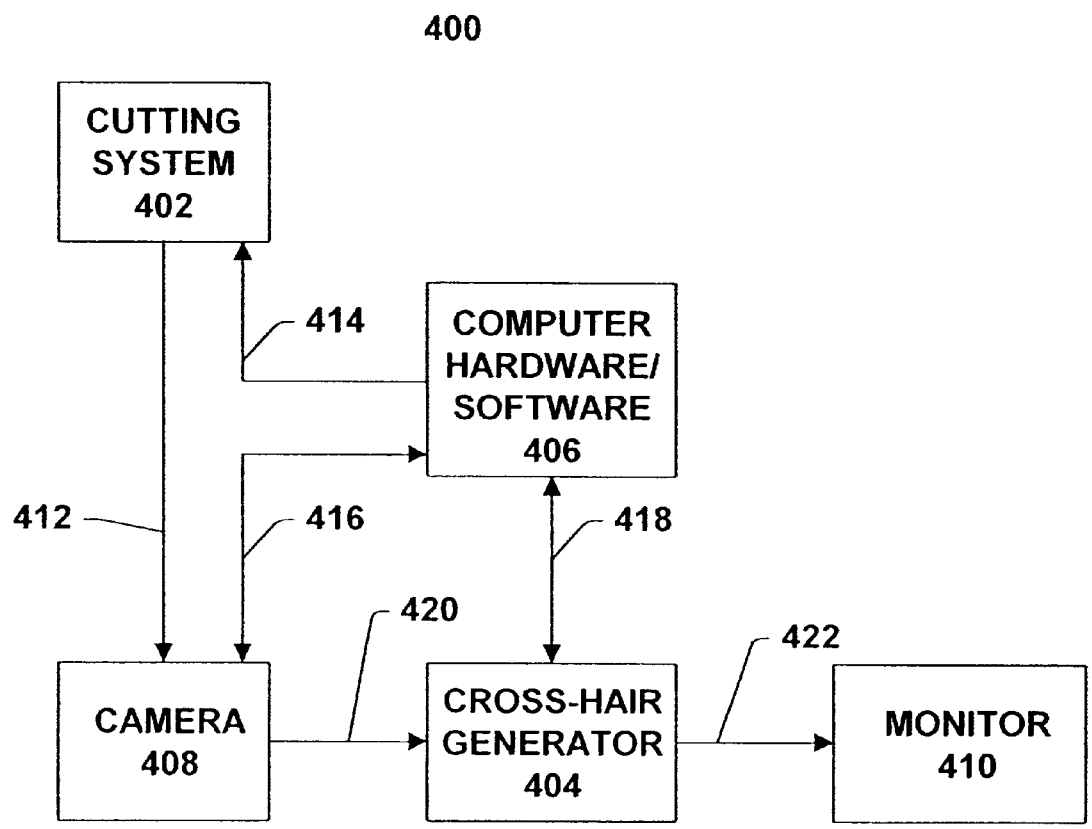
FIG. 4 illustrates another embodiment of the invention, which uses a fluid jet cutting system having a visual alignment system.

FIG. 4 illustrates another embodiment of the invention, which uses a fluid jet cutting system 402 having a visual alignment system. In this embodiment, cuts through a wafer (not shown) by a visually aligned dicing machine or other cutting machine are not necessary prior to placement in the fluid jet cutting system 402. The fluid jet cutting system 402, by the addition of a visual alignment system, attains sufficient accuracy and repeatability of die cutting, regardless of photolithography variations in the dice locations.

This visual alignment system includes a cross-hair generator 404, computer hardware/software 406, one or more cameras 408, a monitor 410, and a positioning system (not shown) inside the cutting system 402 to optically align the X-axis, Y-axis, and theta orientation of the wafer to the X-axis, Y-axis, and theta orientation of the fluid jet cutting system 402. The visual alignment system uses a camera 408 to locate the wafer alignment marks made by the same photolithography that fabricated the wafer dice. Camera 408 is typically at a distance from the cutting nozzle, but would preferably receive signals 412 to close camera shutters to protect the lenses from splashing water. Camera 408 provides signals to 420 t0 cross-hair generator 404, which in turn provides signals 422 to monitor 410.

Computer hardware and software 406 interpret and measure the alignment marks using signals 414, 416, and 418 to adjust the coordinates of the cutting system 402 to the coordinates of camera 408 and cross-hair generator 418 to properly align the dice cuts on the wafer. One embodiment adjusts the cutting system's coordinate axes, but an alternative embodiment moves the fixture to align the wafer coordinate axes to the cutting system's coordinate axes.

Figure 5:
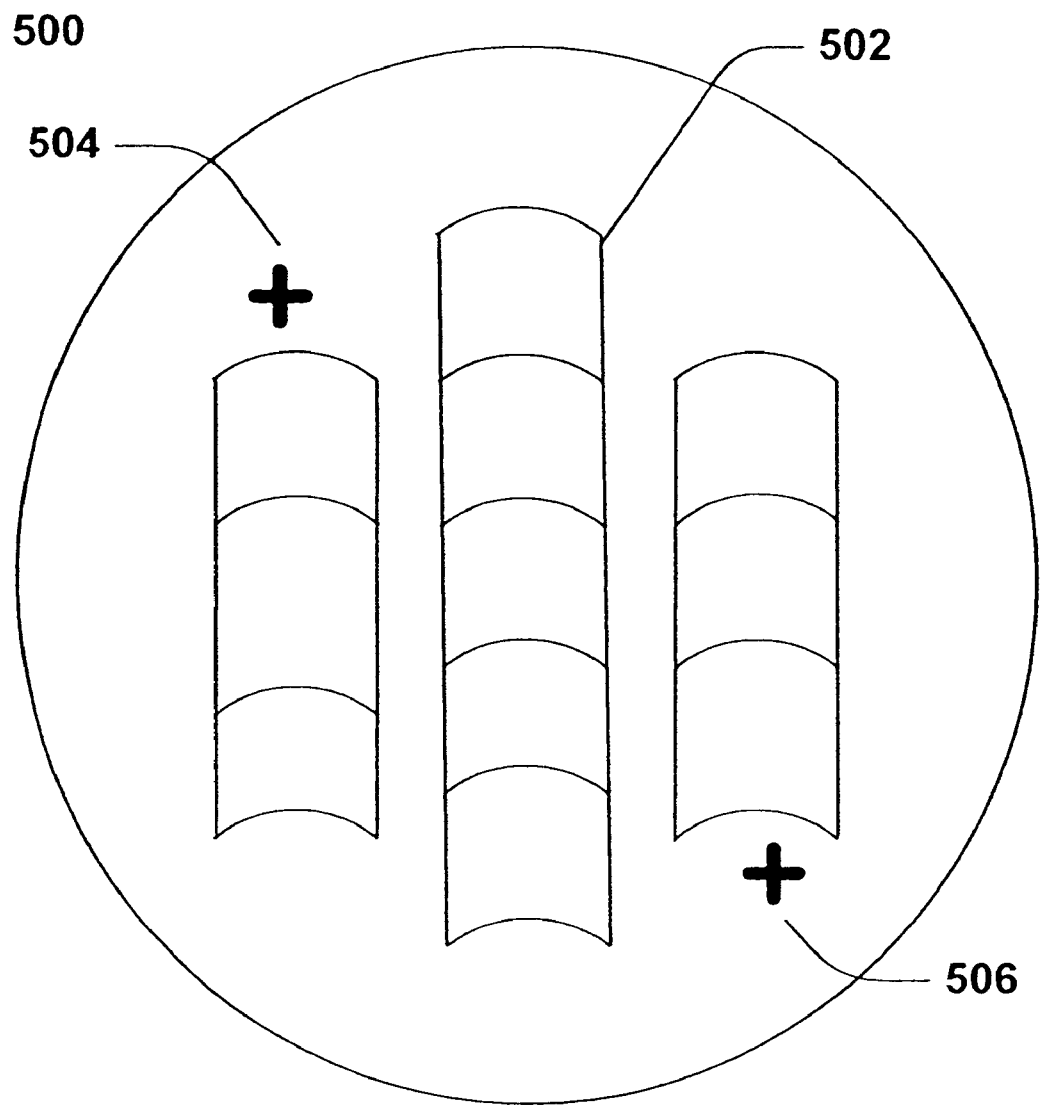
FIG. 5 illustrates one embodiment of a wafer with alignment marks for visual alignment by means of one or more cameras.

FIG. 5 illustrates one embodiment of a wafer 500 with irregular dice 202 and alignment marks 504 and 506 for visual alignment by means of one or more cameras In other embodiments, the alignment marks 504 and 506 on the wafer 500 each have a horizontal visible line width ranging from approximately 5 mils to 100 mils (0.0127 cm to 0.254 cm). In other embodiments, the two perpendicular visible lines comprising the crosses of the alignment marks 504 and 506 each have a length ranging from approximately 50 to 250 mils (0.127 cm to 0.635 cm) sufficient for accurate resolution by a camera and monitor (not shown).

Alterative embodiments of the invention can use other alignment mark shapes (e.g., circles, triangles, rectangles, or other polygon shapes), or use the normally occurring optical alignment marks used during the photolithography process that fabricated the wafer.

Figure 6:
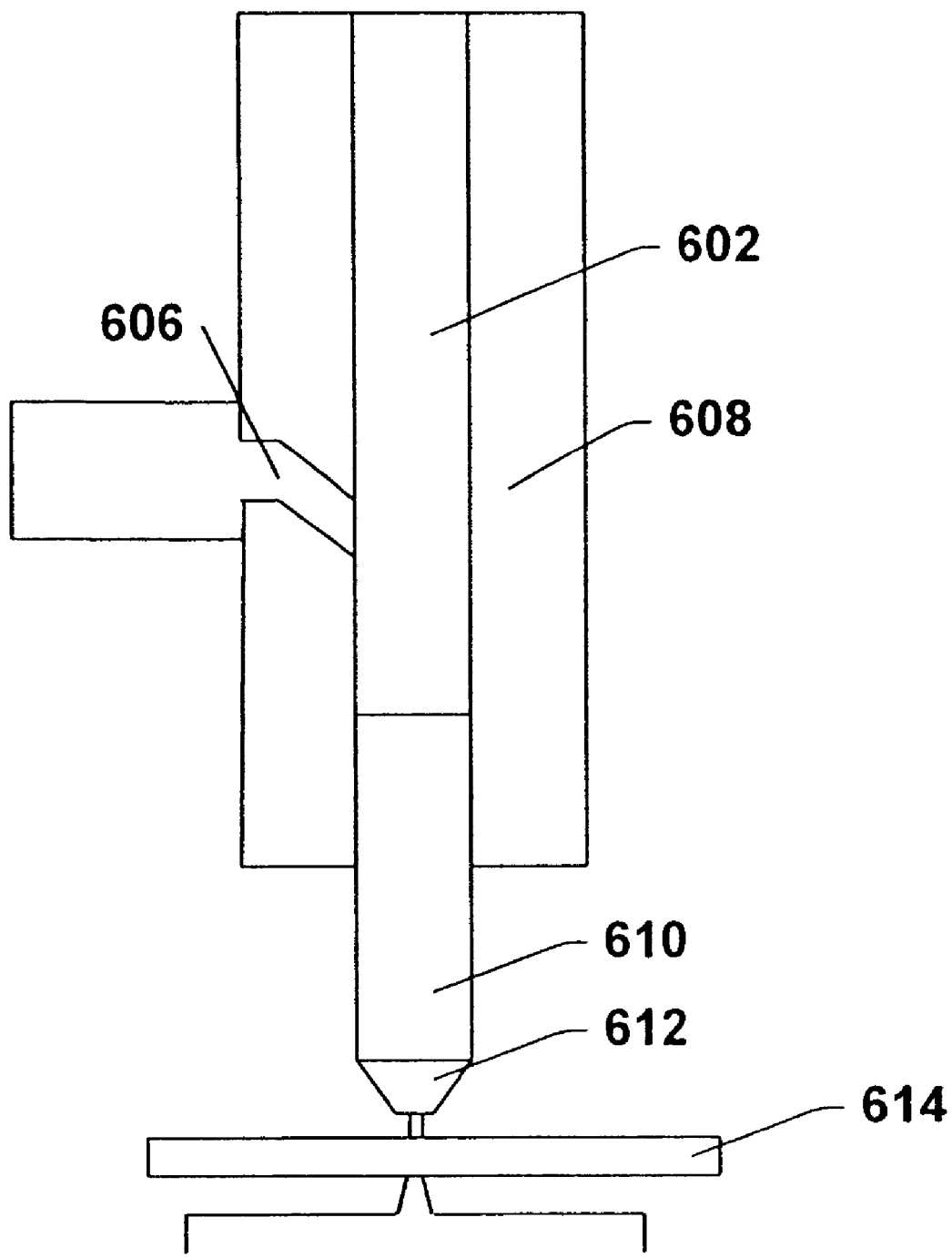
FIG. 6 illustrates one embodiment of a cutting head assembly.

FIG. 6 illustrates one embodiment of a cutting head assembly 600. The cutting head assembly 600 includes a cylinder 602 to supply water at high pressure, one or more abrasive inlet(s) 606 to supply abrasive powder, the cutting head body 608, a mixing tube 610 to mix the water and abrasive, and a nozzle 612. In other embodiments, the nozzle 612, interior of the mixing tube 610 and/or interior of the cylinder 602 is made from ruby, sapphire, or diamond; but other equivalent materials can be used in alternative embodiments of the invention. The nozzle 612 typically moves in relation to the wafer 614 at a velocity ranging from a minimum of approximately 0.2 inch (0.254 cm) per minute to a maximum of approximately 200 inches (508 cm) per minute.

Figure 7:
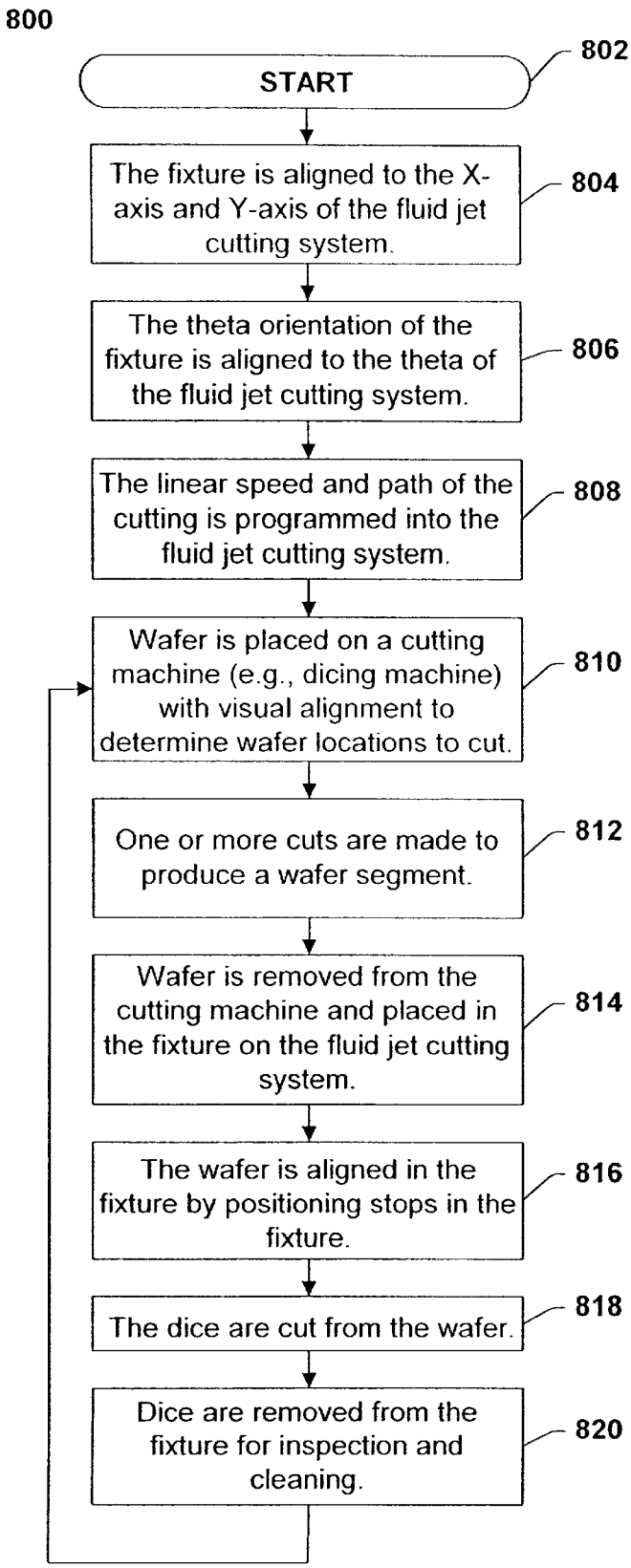
FIG. 7 shows a flow chart to align and cut a wafer on a fluid jet cutting system in accordance with one embodiment of the invention.

FIG. 7 shows a flow chart 800 to align and cut a wafer on fluid jet cutting system in accordance with one embodiment of the present invention. The method starts in operation 802, which is followed by operation 804. In operation 804 the fixture is aligned to the X-axis, Y-axis, and Z-axis of the fluid jet cutting system for accurate cutting of dice from the wafer. Then in operation 806 the theta 6f the fixture is aligned to the theta of the fluid jet cutting system for accurate cutting of dice from the wafer. Then in operation 808 the linear speed and path of the cutting is programmed into the fluid jet cutting system. In operation 810, the wafer is first placed on a cutting machine with visual alignment by machine vision, such as a dicing machine. In another embodiment of the invention, the same alignment marks used for photolithography are used by visual alignment system of the dicing machine to determine where and how to cut the perimeter of the wafer with respect to the positional displacement or drift of the dice on the wafer. In an alternative embodiment, two or more special alignment marks (e.g., visible crosses, circles, or other polygon shapes) are especially fabricated on the wafers during the wafer fabrication for the alignment of the cutting machine. Then operation 812 is next, where one or more cuts are made through the wafer. Then operation 814 is next, where the wafer is removed from the cutting machine and placed in a fixture on the fluid jet cutting system. In operation 816 the wafer is aligned in the fixture by positioning stops in the fixture, which could either be three or more pins, one or more pins and a fence, or two fences. Then in operation 818 actual cutting of the dice is performed. The method ends in operation 820, where the fixture is removed from the fluid jet cutting system and the dice are removed from the fixture for inspection and cleaning. If the fixture has a top and bottom half, then only the top half of the fixture and the dice are removed from the system, and the bottom half of the fixture with the positioning stops remains clamped in place in the system. If another wafer needs to be cut, then step 810 is next.

Figure 8:
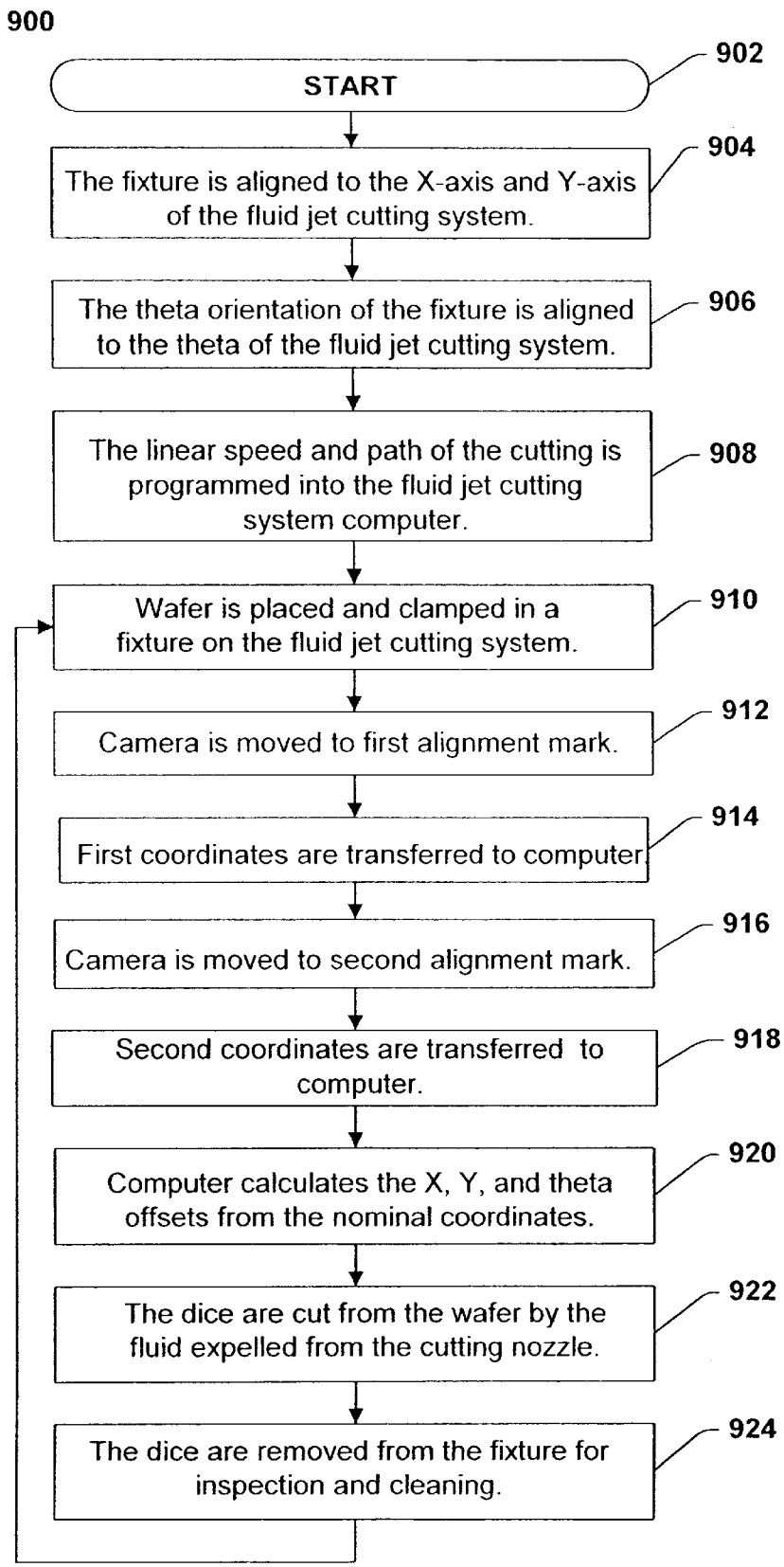
FIG. 8 shows a flow chart to cut dice from a wafer in accordance with another embodiment of the invention.

FIG. 8 shows a flow chart 900 for cutting dice from a wafer in accordance with another embodiment of the invention. The method starts in operation 902. Then in operation 904 the fixture is aligned to the X-axis and Y-axis of the fluid jet cutting system for accurate cutting of dice from the wafer. Then in operation 906 the theta of the fixture is aligned to the theta of the fluid jet cutting system for accurate cutting of dice from the wafer. Then in operation 908 the linear speed and path of the cutting is programmed into the fluid jet cutting system. Operation 910 is next, where the wafer is placed in as fixture on the fluid jet cutting system. Then in operation 912 the camera in the visual alignment system in the fluid jet cutting system is moved to the first alignment mark on the wafer. Then in operation 914 the coordinates of the first alignment mark are transferred to the computer. Then in operation 916 the camera is moved to the second alignment mark. Then in operation 918 the coordinates of the second alignment mark are transferred to the computer. Then in operation 920 the computer calculates the X, Y, and theta offsets from the nominal coordinates. Then in operation 922 the actual cutting of the dice is performed. The method ends in operation 924, where the dice are removed from the fluid jet cutting system for inspection and cleaning. If the fixture has a top and bottom half, only the top half of the fixture and the dice are removed from the system, and the bottom half of the fixture with the positioning stops remains clamped in place in the system. If another wafer needs cutting, then step 910 is next.

The dice can be cleaned with one or more cleaning fluids, preferably including isopropyl alcohol. Commercial grade isopropyl alcohol and acetone for post-cut cleaning of residues from the dice are available from any chemical supply company. Alternative embodiments use other cleaning fluids (e.g., halogenated hydrocarbons, terpenes, or soap and water).

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A method to cut a plurality of dice from a wafer, comprising:
   placing said wafer on a fixture;
   aligning said wafer in said fixture to expose said plurality of dice to a fluid jet cutting nozzle, said fluid jet cutting nozzle comprises a water jet cutting nozzle;
   supplying an abrasive to said fluid jet cutting nozzle;
   supplying a pressurized fluid to said fluid jet cutting nozzle, the fluid comprising water;
   expelling said abrasive in combination with said fluid from said fluid jet cutting nozzle at a velocity sufficient to cut through said wafer, while said fluid jet cutting nozzle moves in relation to said wafer in said fixture in a curvilinear manner; and
   removing said plurality of dice from said fixture after said plurality of dice have been cut from said wafer, said plurality of dice contain a plurality of non-rectangular planar light-wave circuits.

2. The method of claim 1, said wafer comprising one or more selected from the group consisting of pure silicon, doped silicon, germanium, semiconductor compounds of III–V elements, and semiconductor compounds of II–VI elements.

3. The method of claim 1, the fluid expelled from the fluid jet cutting nozzle comprises from about 5% to about 60% by weight of the abrasive.

4. The method of claim 1, wherein said abrasive comprises at least one from the group consisting of garnet, olivine, corundum, aluminum oxide, silica, tungsten carbide, silicon carbide, and diamond.

5. The method of claim 1, wherein said abrasive is chosen to have an average particle diameter ranging from a minimum diameter of 0.1 micron to maximum diameter of 200 microns.

6. The method of claim 1, wherein said fluid is pressurized to a pressure ranging a minimum pressure of 2,000 pounds per square inch (130 bar) to a maximum pressure of 100,000 pounds per square inch (7000 bar).

7. The method of claim 1, wherein said wafer is cut prior to placing said wafer in said fixture and aligned in said fixture by a plurality of fixture stops.

8. The method of claim 1, wherein said wafer is optically aligned to said fluid jet cutting nozzle by a visual alignment system.

9. The method of claim 1, wherein the movement of said fluid jet cutting nozzle in relation to said wafer is at a velocity ranging from a minimum of 0.1 inch per minute to a maximum of 100 inches per minute.

10. The method of claim 1, wherein aligning said wafer in said fixture includes using a plurality of physical structures on said fixture to align said wafer in said fixture.

11. The method of claim 1, further comprising: cleaning said plurality of dice after said plurality of dice are cut from said wafer.

12. The method of claim 1, further comprising:
    shifting a first X-axis and Y-axis coordinate reference of said water jet cutting nozzle to correspond to a second X-axis coordinate reference of said wafer.

13. The method of claim 1 further comprising:
    shifting a first theta coordinate reference of said water jet cutting nozzle to correspond to a second theta coordination reference of said wafer.

14. The method of claim 1 further comprising:
setting the linear speed and path of movement of said water jet cutting nozzle relative to said wafer.

15. A wafer die cutting system to cut a wafer, comprising:
a fixture to align and hold said wafer, said wafer comprising one or more selected from the group consisting of pure silicon, doped silicon, germanium, semiconductor compounds of III–V elements, and semiconductor compounds of II–VI elements;
a cutting nozzle to expel a fluid comprising water and an abrasive towards said wafer at a velocity sufficient to cut through said wafer;
a fluid source to supply said water to said cutting nozzle;
an abrasive source to supply said abrasive to said cutting nozzle; and
a mechanism to move said cutting nozzle relative to said wafer in a curvilinear manner.

16. The wafer die cutting system to claim 15, further comprising an alignment system to align the movement of said cutting nozzle to the alignment of said wafer die on said wafer.

17. The wafer die cutting system of claim 16, further comprising one or more cameras to find a plurality of alignment marks on said wafer to align the movement of said cutting nozzle to the alignment of said wafer die on said wafer.

18. The wafer die cutting system of claim 16, further comprising:
one or more cameras to find a plurality of alignment marks on said wafer;
a cross-hair generator to generate a cross-hair to overlay an alignment mark from said plurality of alignment marks;
one or more television monitors to align said cross-hair of said cross-hair generator over an alignment mark from said plurality of alignment marks; and
a means for moving said cutting nozzle after alignment of a plurality of coordinates of said wafer die cutting system to a plurality of coordinates of said wafer die on said wafer.

19. The wafer die cutting system of claim 15, wherein said abrasive is selected to have an average particle diameter ranging from a minimum of 0.1 micron to a maximum of 100 microns.

20. The wafer die cutting system of claim 15, wherein said abrasive is chosen from the group of abrasives consisting of: garnet, olivine, corundum, aluminum oxide, silica, tungsten carbide, silicon carbide, and diamond.

21. The wafer die cutting system of claim 15, wherein said fluid is water pressurized to a pressure between a minimum pressure of 2,000 pounds per square inch (130 bar) to a maximum pressure of 100,000 pounds per square inch (7000 bar).

22. A wafer die cutting system to cut a wafer, comprising:
a fixture to align and hold said wafer;
a cutting nozzle to expel a fluid and an abrasive towards said wafer at a velocity sufficient to cut through said wafer;
a fluid source to supply said fluid to said cutting nozzle;
an abrasive source to supply said abrasive to said cutting nozzle;
a mechanism to move said cutting nozzle relative to said wafer;
an alignment system to align the movement of said cutting nozzle to the alignment of said wafer die on said wafer;
one or more cameras to find a plurality of alignment marks on said wafer;
a cross-hair generator to generate a cross-hair to overlay an alignment mark from said plurality of alignment marks;
one or more television monitors to align said cross-hair of said cross-hair generator over an alignment mark from said plurality of alignment marks; and
a means for moving said cutting nozzle after alignment of a plurality of coordinates of said wafer die cutting system to a plurality of coordinates of said wafer die on said wafer.

23. The wafer die cutting system of claim 22, further comprising one or more cameras to find a plurality of alignment marks on said wafer to align the movement of said cutting nozzle to the alignment of said wafer die on said wafer.

24. The wafer die cutting system of claim 22, wherein said abrasive is selected to have an average particle diameter ranging from a minimum of 0.1 micron to a maximum of 100 microns.

25. The wafer die cutting system of claim 22, wherein said abrasive is chosen from the group of abrasives consisting of: garnet, olivine, corundum, aluminum oxide, silica, tungsten carbide, silicon carbide, and diamond.

26. The wafer die cutting system of claim 22, wherein said fluid is water pressurized to a pressure between a minimum pressure of 2,000 pounds per square inch (130 bar) to a maximum pressure of 100,000 pounds per square inch (7000 bar).

* * * * *